United States Patent Office 2,893,868

Patented July 7, 1959

2,893,868

POLYMERIZABLE COMPOSITIONS

Arthur Livingston Barney, Wilmington, Del., assignor to E. I. du Pont de Nemours and Company, Wilmington, Del., a corporation of Delaware No Drawing. Application August 22, 1955 Serial No. 529,903

15 Claims. (Cl. 96—115)

This invention relates to addition polymerizable compositions and more particularly to such compositions comprising an addition polymer containing extralinear salt-forming groups, an ethylenically unsaturated addition polymerizable complementary salt-forming monomer and an addition polymerization initiator. The invention also relates to processes of making shaped articles including printing reliefs from such compositions.

An object of this invention is to provide a new class of addition polymerizable compositions. Another object is to produce such compositions which are soluble in organic solvents but on addition polymerization are capable of being converted to solvent-insoluble cross-linked polymers. Yet another object is to provide such compositions which can be polymerized with actinic light to form shaped articles. A further object is to provide such compositions which can be used to make relief images and particularly printing reliefs by photopolymerization. A still further object is to provide new processes of making printing reliefs. Still other objects will be apparent from the following description of the invention.

The addition polymerizable compositions of this invention comprise as the essential constituents (1) an addition polymer component with a main carbon chain having a plurality of extralinear salt-forming groups, (2) an ethylenically unsaturated addition polymerizable monomer component having at least one complementary salt-forming group and (3) an addition polymerization initiator. These compositions for many purposes need not be light transparent, but when used for the preparation of printing reliefs are essentially transparent to actinic light, it being understood, however, that the initiators while essentially transparent absorb light and are activated. The compositions may, of course, contain other materials such as solvents, plasticizers, finely divided fillers, etc. as will be explained more fully below.

The polymeric component is preferably saturated but can be unsaturated and generally is at least 2500 and preferably at least 5000 in molecular weight. The composition of the polymeric component is immaterial, provided that it has a wholly carbon main chain and contains a plurality of salt-forming groups as lateral substituents thereon to the extent of at least 1.0% and preferably at least 10% on a molar basis calculated on all the combined monomer units. The extent of lateral salt-forming groups can be as high as desired with the upper limit being 100% on a molar combined monomer unit basis, i.e., each combined monomer unit carrying one or more lateral salt-forming groups. Other functionally substituted combined units can also be present, including those containing ethylenically unsaturated, addition polymerizable groups as lateral substituents. Similarly, non-functionally substituted combined units can also be present. Mixtures of two or more different polymers containing salt-forming radicals or groups can also obviously be used. Likewise, two or more ethylenically unsaturated complementary salt-forming monomers can be used. In general, the salt-forming polymers and monomers should be, respectively, each of the same type, e.g., mixtures of sulfonic acid and carboxylic acid addition polymers with polymerizable ethylenically unsaturated secondary and tertiary amines.

Typical salt-forming addition polymers are those carrying strongly acid groups, e.g., carboxyl, sulfonic, phosphonic, sulfate, phosphate, and the like, or strongly basic groups, e.g., primary, secondary, and tertiary amino, as lateral substituents to the main polymer chain.

The monomeric component of these new compositions consists of one or more ethylenically unsaturated, addition polymerizable monomers of which one or more such monomers carry a complementary salt-forming functional group or groups in overall amount from at least 10% up to 500%, or higher, calculated on a molar basis, of the complementary salt-forming functional lateral substituents in the polymer component. Since the salt-forming reaction is generally an equilibrium, the relative amounts of complementary salt-forming polymeric and monomeric components will vary widely with the relative acid and basic strengths of the salt-forming radicals or groups involved and also with the degree of ionic crosslinks which it is desired to establish in the final product. Thus, with a relatively weakly acidic or basic polymer a strong complementary salt-forming monomer or an excess of a weak complementary salt-forming monomer will be used, both relative salt-forming strength and degree of stoichiometric excess depending on the degree of ionic crosslinks it is desired to establish, both being higher as the desired degree of crosslinks increases, and vice versa. The preferred monomeric components are the ethylenically unsaturated addition polymerizable monomers wherein the unsaturation is terminal, i.e., the vinylidene monomers.

Depending upon whether the polymerizable composition is to be set, i.e., undergo addition polymerization, by means of heat and/or actinic light, the addition polymerization initiator will be chosen, respectively, from those activatable by heat and/or light, generally of wavelengths in the range 1800 to 7000 A., and should be present in amount from 0.05 to 5.0%, by weight, based on the ethylenically unsaturated addition polymerizable monomer present in the entire composition.

The new compositions of this invention can be prepared in many ways from the three essential constituents specified above, i.e., (*a*) the polymeric component containing a plurality of lateral salt-forming radicals or groups and having a wholly carbon main chain, (*b*) the addition polymerizable, ethylenically unsaturated, complementary salt-forming monomer and (*c*) the free radical generating addition polymerization initiator, by admixing them in any order, and, if desired, with the aid of a solvent. Conventional milling, mixing, and solution techniques can be applied, the particular technique varying with the differences in properties of the respective components. Care must be taken in preparing a homogeneous admixture of these three components, along with any other added materials, so as not to activate the polymerization initiator so as to induce polymerization, or to induce polymerization in any other manner, or to degrade any of the components.

In order to prevent addition polymerization prior to use, there may be incorporated in the compositions a minor amount, for example, 1 to 500 parts per million of the whole of a stabilizer which prevents addition polymerization, e.g., hydroquinone and tertiary-butyl catechol. Such polymerization inhibitors improve the storage stability of these compositions by preventing premature thermal polymerization or that induced by accidental exposure to adventitious light.

The following examples, in which the parts given are by weight, are submitted to illustrate further the invention but not to limit it.

*Example 1*

A solution of 2.4 parts of a viscous liquid low molecular weight β-diethylaminoethyl methacrylate homopolymer, one part of methacrylic acid monomer (0.9 stoichiometric proportion based on the amine groups of the polymer), and 0.05 part of benzoin methyl ether as a light-activated addition polymerization initiator in 2.6 parts of benzene was cast about 40 mils thick on a glass plate and the benzene allowed to evaporate at room temperature in the dark over a period of 20 hours. A photographic line negative carrying a letter text in clear areas on a black background was placed in intimate contact, using a sheet of cellophane as a parting member with the resultant 15- to 20-mil thick viscous layer on the glass plate. The assembly (glass down) was placed on a gray-black surface (providing an antihalation background) and exposed for a period of 30 minutes to the light from a 275-watt mercury vapor sunlamp at a distance of 8 inches. After removal of the negative and the parting member, the unexposed areas of the β-diethylaminoethyl methacrylate polymer/methacrylic acid monomer/benzoin methyl ether composition corresponding to the opaque areas in the negative were removed by washing with benzene for 3 to 5 minutes at room temperature. There was obtained a raised, printing relief image of the letter text in the clear areas of the line negative which exhibited excellent fidelity and sharpness. Similar results were obtained with two parts of the methacrylic acid monomer, corresponding to almost two moles of the acid monomer per base mole of polymer.

*Example 2*

A solution of 1.5 parts of a 75/25 (molar) butyl methacrylate/β - diethylaminoethyl methacrylate copolymer, 0.3 part of methacrylic acid monomer (about 1.75 molar proportions based on the amine groups), and 0.02 part of benzoin methyl ether in 8.5 parts of dioxane was cast on a glass plate and the solvent allowed to evaporate in the dark, as in Example 1. Exposure under a suitable line negative of the about 15-mil thick tacky sheet and removal of the unexposed copolymer/monomer/photoinitiator composition, as described in Example 1, using dioxane in place of benzene as the developing solvent resulted in a hard, solid printing relief image in excellent detail of the letter text of the negative, said relief being bound tenaciously to the glass plate.

Similar results were obtained by using 0.6 part of methacrylic acid monomer (about 3.5 molar proportions per base mole of copolymer), except that the unexposed film was slightly softer and tackier. Similar results were also obtained with like compositions containing as the copolymer a 50/50 (molar) butyl methacrylate/β-diethylaminoethyl methacrylate copolymer, except that the unexposed films were very tacky. The printing relief images obtained after exposure and development had the same properties as those obtained with the first composition of this example. A control composition without any methacrylic acid monomer when similarly processed resulted in the formation of no visible relief image and no dioxane insoluble material.

*Example 3*

A solution of 2.8 parts of a low molecular weight 50/50 (weight) methyl methacrylate/β-diethylaminoethyl methacrylate copolymer, 0.65 part of methacrylic acid monomer (stoichiometrically equivalent to the amine groups in the copolymer) and 0.0065 part (1% based on the methacrylic acid monomer) of benzoin methyl ether in 8 parts of methyl ethyl ketone was cast about 30-mils thick on a glass plate and the solvent allowed to evaporate at room temperature in the dark, as in Example 1. A clear, hard and dry film about 10-mils thick of the monomeric methacrylic acid salt of the basic copolymer with benzoin methyl ether homogeneously dispersed therethrough was obtained. Exposure under a suitable line negative and removal of unexposed material, as described in Example 1, using acetone in place of benzene as the developing solvent, resulted in a clear, sharp, raised printing relief image of the letter text in the line negative. The image was not appreciably affected by subsequent soaking in water for 30 minutes, evidencing the stable nature of the ionically crosslinked copolymer.

*Example 4*

A solution of 0.96 part of a 75/25 (weight) butadiene/2-vinylpyridine copolymer, one part of methacrylic acid monomer (about 5.0 molar proportions based on the amine groups in the copolymer), and 0.05 part of benzoin methyl ether in 11.04 parts of dioxane was cast on a glass plate and the dioxane solvent allowed to evaporate at room temperature in the dark, as in Example 1. There resulted a slightly tacky, rubber-like adherent film about 5-mils thick of the benzoin methyl ether/butadiene/2-vinylpyridine copolymer/methacrylic acid monomer salt composition. Upon exposure under a suitable line negative and removal of the unexposed photosensitive composition, as described in Example 1, using dioxane as the developing solvent, a raised printing relief image of good sharpness, fidelity and detail was obtained.

*Example 5*

A solution of one part of a 75/25 (weight) butadiene/methacrylic acid copolymer, 0.5 part (essentially equimolar with the polymer) of β-diethylaminoethyl methacrylate monomer, and 0.05 part of benzoin methyl ether in 9.0 parts of dioxane was cast on a glass plate and the dioxane solvent was allowed to evaporate in the dark at room temperature, as in Example 1. There was obtained an adherent rubbery, about 10-mil thick film of the bezoin methyl ether, butadiene/methacrylic acid copolymer/basic monomer salt composition. Exposure under a suitable line negative and removal of unexposed material, as described in Example 1, using dioxane as the developing solvent, resulted in the formation of a raised printing relief image of the letter text in the line negative having good sharpness.

Similar results were obtained by using 0.3 part, 0.8 part, and 1.2 parts of the β-diethylaminoethyl methacrylate monomer, respectively, 0.6, 1.6 and 2.4 molar proportions based on the acid groups of the copolymer. The best results were obtained from 0.5 to 1.6 proportions. The relief images were in all cases hard and sharp and carried deep recesses and were suitable for printing reliefs.

*Example 6*

A solution of one part of a 75/25 (weight) butadiene/methacrylic acid copolymer, 0.5 part (1.7 molar proportions based on the acid groups) of 2-vinyl-pyridine monomer, and 0.05 part of benzoin methyl ether in 9.0 parts of dioxane was cast on a glass plate and the dioxane solvent allowed to evaporate in the dark at room temperature. There was obtained an adherent rubber-like film about 10-mils thick of the benzoin methyl ether/acid copolymer/pyridine monomer salt composition. Exposure under a suitable line negative and removal of unexposed material, as described in detail in Example 1, but with dioxane as the developing solvent, resulted in the formation of a raised printing relief image carrying a reproduction of the letter text in the line negative in good sharpness and detail.

Similar results were obtained using 0.3 part, 0.8 part and 1.2 parts (respectively, 1.0, 2.7 and 4.0 molar proportions) of the 2-vinylpyridine monomer. The best results were obtained from the 1.0 to 2.7 proportions. The printing relief images were in all cases fairly hard and sharp and carried deep recesses.

*Example 7*

A solution of 3.0 parts of a 50/50 (weight) methyl methacrylate/methacrylic acid copolymer, 0.5 part (0.16 molar proportion based on the acid groups) of β-diethylaminoethyl methacrylate monomer, and 0.1 part of benzoin methyl ether in 6.0 parts of dioxane was cast and the solvent allowed to evaporate, as described in Example 1. A dry, non-tacky, adherent film of the benzoin methyl ether/acid copolymer/β-diethylaminoethyl methacrylate monomer salt composition was obtained. Exposure under a suitable line negative and removal of the unexposed material, after the manner described in Example 1, using dioxane as the developing solvent, resulted in a hard, sharp, excellently detailed, raised relief image of the letter text in the line negative which when printed gave faithful press reproductions of the original text.

Similar results were obtained using 1, 2 and 3 parts (respectively, 0.33, 0.67 and 1.0 molar proportions) of the β-diethylaminoethyl methacrylate monomer.

*Example 8*

A solution of 2.0 parts of an 86/13/1 vinyl chloride/vinyl acetate/maleic acid terpolymer, 0.2 part (5.0 molar proportions based on the acid groups) of β-diethylaminoethyl methacrylate monomer, and 0.1 part of benzoin methyl ether in a mixture of 5.0 parts of tetrahydrofuran and 0.5 part of 95% ethyl alcohol was cast on a glass plate and the solvent mixture was allowed to evaporate, as described in Example 1. There was obtained a clear, dry, hard, adherent film about 15-mils thick of the β-diethylaminoethyl methacrylate monomer salt of the acid copolymer containing homogeneously dispersed therethrough the benzoin methyl ether. Exposure under a suitable line negative and removal of unexposed material, as described in Example 1, with a 90/10 mixture of tetrahydrofuran and 95% ethyl alcohol as the developing solvent, resulted in the formation of a clear, slightly rounded, raised printing relief image of the letter text in the line negative.

*Example 9*

A solution of 2.0 parts of a 50/50 (weight) isobutyl methacrylate/methacrylic acid copolymer, 0.5 part (0.25 molar proportion based on the acid groups) of β-diethylaminoethyl methacrylate monomer, 0.2 part of benzoin methyl ether and 0.02 part hydroquinone (as a polymerization inhibitor) in seven parts of dioxane was cast on a glass plate and the solvent was allowed to evaporate, as described in Example 1. A clear, dry, adherent film of the β-diethylaminoethyl methacrylate monomer salt of the acid copolymer with benzoin methyl ether and hydroquinone homogeneously dispersed therethrough was obtained. Exposure under a suitable line negative and removal of the unexposed composition, as described in Example 1 but with a 90/10 by weight dioxane/water solution as the developer, resulted in a clear, hard, sharp, raised printing relief image of the letter text in the line negative which, when inked and printed, formed faithful copies of the text.

Similar results were also obtained using one part (0.5 molar) of the β-diethylaminoethyl methacrylate monomer. Higher proportions, i.e., 2 or 3 parts (respectively, 1- and 1.5-molar) of the β-diethylaminoethyl methacrylate monomer resulted in somewhat softer, less sharp, raised reliefs.

*Example 10*

A solution of about 2.5 parts of a 50/50 (weight) n-butyl acrylate/methacrylic acid copolymer, 0.5 part (0.50 molar proportion based on the acid groups) of β-diethylaminoethyl methacrylate monomer, 0.02 part of hydroquinone and 0.2 part of benzoin methyl ether in about 6.5 parts of a 90/10 dioxane/ethyl alcohol solvent mixture was cast on a glass plate and the solvent mixture was allowed to evaporate at room temperature in the dark. A clear, dry, adherent film of the β-diethylaminoethyl methacrylate monomer salt of the acid copolymer with benzoin methyl ether and hydroquinone homogeneously dispersed therethrough was obtained. Exposure under a suitable line negative and removal of the unexposed composition, as described in Example 1, but with dioxane as the developing solvent, resulted in the formation of a clear, very sharp, hard, raised relief image of the letter text in the line negative, which, after inking and printing, gave a faithful reproduction of the text of the negative.

A duplicate experiment using aquous 1% sodium bicarbonate solution as the developing solvent in place of the dioxane gave substantially identical results. Similar experiments using 1, 2 or 3 parts (respectively, 1-, 2- or 3-molar) of the β-diethylaminoethyl methacrylate monomer and either dioxane or aqueous 1% sodium bicarbonate solutions in the image development step gave similar results.

*Example 11*

A solution of about 1.5 parts of a 75/75 (weight) butadiene/methacrylic acid copolymer, 0.3 part (0.4 molar proportion based on the acid groups) of β-diethylaminoethyl methacrylate monomer, 0.02 part of hydroquinone and 0.1 part of benzoin methyl ether in about 8.5 parts of a 90/10 dioxane/ethyl alcohol solvent mixture was cast on a glass plate and the solvent mixture allowed to evaporate at room temperature in the dark. A clear, dry, adherent film of the β-diethylaminoethyl methacrylate monomer salt of the acid copolymer with benzoin methyl ether and hydroquinone homogeneously dispersed therethrough was obtained. Exposure of this film under a suitable line negative and removal of the unexposed composition, as described in Example 1, using dioxane as the developing solvent, resulted in the formation of a clear, sharp, raised printing relief image of the letter text in the line negative.

A duplicate experiment using aqueous 1% sodium bicarbonate solution as the developing solvent in place of the dioxane gave similar results.

*Example 12*

A solution of four parts of a 70/30 (weight) butyl methacrylate/methacrylic acid copolymer, 2 parts (0.77-molar proportion based on the acid groups) of β-diethylaminoethyl methacrylate monomer, 0.5 part of triethylene glycol dimethacrylate, 0.1 part of benzoin methyl ether, and 0.015 part of hydroquinone in six parts of 95% ethyl alcohol was cast on a glass plate and the solvent allowed to evaporate in the dark at room temperature. A clear, dry film of the dimethacrylate/acid copolymer/β-diethylaminoethyl methacrylate monomer salt composition containing benzoin methyl ether and hydroquinone homogeneously dispersed therethrough was obtained. Exposure under a suitable line negative and development, according to the procedure of Example 1, using dioxane in place of benzene, resulted in the formation of a clear, hard, sharp, raised printing relief image of the letter text of the negative. A substantially identical product was obtained from another such experiment using aqueous ammonia as the developing solvent.

*Example 13*

A solution of three parts of a phosphated 60/40 (weight) butyl methacrylate/glycidyl methacrylate copolymer containing lateral phosphoric acid groups (prepared by treatment of the parent copolymer in acetone solution with excess 85% phosphoric acid as given in greater detail in the assignee's copending application of M. E. Cupery Ser. No. 345,233, filed March 27, 1953, U.S. Patent 2,723,971, November 15, 1955), 2 parts of β-diethylaminoethyl methacrylate, and 0.1 part of benzoin methyl ether in 9 parts of dioxane was cast on a glass plate and the solvent allowed to evaporate at room temperature in the dark. A clear, dry film of the β-diethylaminoethyl methacrylate monomer salt of the phosphated copolymer was obtained. Exposure of this film through a suitable line negative and development, as described in Example 1, using dioxane in place of benzene as the solvent, resulted in the formation of a clear, hard, sharp, raised printing relief image of the letter text of the negative.

*Example 14*

A solution of 3 parts of a 94/6 (weight) vinyl acetate/crotonic acid copolymer, 0.3 part (0.77 molar proportion based on the acid groups) of β-diethylaminoethyl methacrylate monomer, and 0.05 part of benzoin methyl ether in about 7 parts of dioxane was cast on a glass plate, and the solvent was allowed to evaporate at room temperature in the dark. There was obtained a clear, slightly tacky film of the β-diethylaminoethyl methacrylate monomer salt of the acid copolymer containing benzoin methyl ether homogeneously dispersed therethrough. Exposure of this film under a suitable line negative and development, i.e., removal of the unexposed areas, as described in Example 1, resulted in the formation of a clear, raised printing relief image of the letter text of the negative.

A similar product was obtained from another substantially identical experiment varying only in that 0.6 part (1.54 molar based on the acid copolymer) of the basic monomer was used.

*Example 15*

A solution of 2.1 parts of a 94/6 (weight) vinyl acetate/allyl sulfonic acid copolymer (precipitated from an aqueous solution of the sodium salt by the addition of sulfuric acid), 0.3 part (1.6 molar proportions based on the acid groups) of β-diethylaminoethyl methacrylate monomer, 0.02 part of hydroquinone, and 0.1 part of benzoin methyl ether in 3.9 parts of dioxane was cast on a glass plate and the solvent was allowed to evaporate at room temperature in the dark. A clear, slightly tacky film of the β-diethylaminoethyl methacrylate monomer salt of the acid copolymer containing benzoin methyl ether and hydroquinone homogeneously dispersed therethrough was obtained. Exposure of this film under a suitable line negative and development (almost instantaneous) in water in the manner of Example 1 resulted in the formation of a clear, raised printing relief image of the letter text of the negative.

A similar product was obtained by substituting for the 94/6 (weight) copolymer a 77/23 vinyl acetate/allyl sulfonic acid copolymer. With the latter copolymer the 0.3 part of monomer represented 0.43 molar proportion based on the acid copolymer.

*Example 16*

A solution of 5 parts of a 50/50 (molar) styrene/maleic anhydride copolymer, 3 parts (0.63 molar proportion based on the maleic anhydride) of β-diethylaminoethyl methacrylate monomer, and 0.1 part of benzoin methyl ether in 8 parts of acetone was cast on a glass plate and the solvent was allowed to evaporate at room temperature in the dark. A clear, dry film of the β-diethylaminoethyl methacrylate monomer salt of the corresponding maleic acid copolymer containing benzoin methyl ether homogeneously dispersed therethrough was obtained. Exposure of this film under a suitable line negative and development, in the manner of Example 1, by using dilute aqueous sodium carbonate in the place of the solvent benzene, resulted in the formation of a clear, hard, sharp raised printing relief image of the letter text of the negative showing excellent fidelity. Similar results were obtained by using dilute aqueous sodium bicarbonate, ammonium hydroxide and water as the developing solvent.

*Example 17*

About 10 parts of an aqueous solution of sodium polyacrylate was added to a solution of 1.61 parts (an equimolar proportion based on the carboxyl anion, i.e., —COO⁻ content of the sodium polyacrylate) of β-methacrylyloxyethyltrimethylammonium methyl sulfate in about 5 parts of oxygen-free water. The resulting solution was placed in a glass reactor which had been flushed with nitrogen and 0.15 part of α,α'-azodiisobutyramidine dihydrochloride was added and the reactor was substantially completely closed to the atmosphere. The reactor and its contents were heated to 65° C. and after one hour the formation of a gel-like layer was noted. The polymerization was continued at 65° C. for a total of 18 hours. The ion-crosslinked polyacrylate/polymethacrylyloxyethyltrimethylammonium salt copolymer thus obtained was insoluble in distilled water, acetone, methanol, benzene, and dimethylformamide, but could be dissolved in a saturated aqueous sodium chloride solution from which the crosslinked copolymer could be regenerated by dilution with water. The ion-crosslinked copolymer appeared substantially identical to that obtained by mixing preformed sodium polyacrylate and poly-β-methacrylyloxyethyltrimethylammonium methyl sulfate. The reactions involved are believed to be as follows:

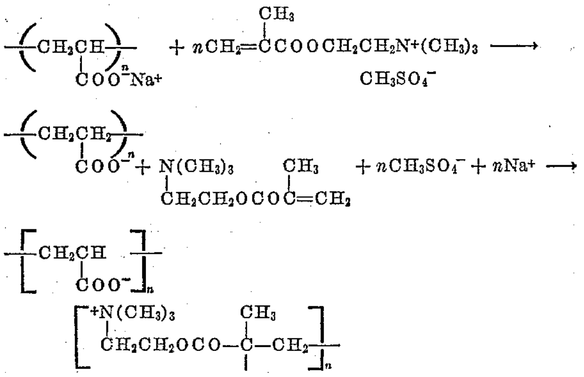

As mentioned previously, the salt-forming polymer/complementary salt-forming monomer/addition polymerization initiator compositions of this invention can be most simply prepared by direct mixing, generally in the presence of an inert diluent, of the salt-forming polymer, complementary salt-forming monomer and initiator. However, as illustrated specifically in the foregoing example, these new compositions can also be prepared by a metathetical reaction between suitable salt derivatives of the salt-forming polymer and complementary salt-forming monomer with the initiator being added either at the point of first interaction or separately later. Desirably, this metathetical reaction is carried out in such manner that the by-product simple, i.e., monomeric, salt formed can be removed. Thus, the metathetical reaction can be carried out in an organic diluent in which both the polymeric and monomeric simple salts are soluble, as well as the end product polymer/monomer salt, but wherein the simple by-product monomeric salt is insoluble. In some instances, the metathetical reaction can be carried out in an aqueous system and the simple monomeric by-product salt formed by addition of an organic diluent precipitated or alternatively, the polymer/complementary monomer salt can be substantially completely extracted from the reaction mixture.

As pointed out previously, these new salt-forming polymer/complementary salt-forming monomer compositions can be polymerized by heat or light, or both. The foregoing discussions for the most part have illustrated the polymerization of these compositions by light alone, particularly as applied to the formation of relief printing images in which instance the compositions must be substantially completely transparent. However, when the compositions are to be polymerized by heat, or heat and light, the compositions need not be essentially transparent, but essentially transparent compositions are preferred in the formation of relief printing images.

For those compositions which are to be thermally polymerized, addition polymerization initiators which are thermally activatable should be present in the polymer/monomer composition. In geenral, any one or more thermally activatable addition polymerization initiators can be used, in amount in excess of 0.05% up to about 5% and preferably from 0.1–2% by weight, based on the amount of addition polymerizable monomer in the composition. Suitable thermal initiators include peroxy compounds, e. g., diacyl peroxides, such as benzoyl and lauroyl peroxides; dialkyl peroxides, e.g., di-tertiary-butyl peroxide; hydroperoxides, e.g., tertiary-butyl hydroperoxide, and hydrogen peroxide; metallic peroxides, e.g., barium and sodium peroxides; metallic peroxy salts, e.g., ammonium, sodium, or potassium persulfates, etc. The peroxy initiators can be used alone or in conjunction with a reducing agent to form a so-called "redox" system, for example, combinations of ferrous ion with the organic hydroperoxides; mercaptans, with the organic peroxides, especially the diacyl peroxides; peroxy salts, e.g., persulfates, in conjunction with bisulfite ion, and the like. Other suitable thermal initiators include azo initiators, e.g., azonitriles for $\alpha,\alpha'$-azodiisobutyronitrile, 1,1'-azodicyclohexanecarbonitrile, etc., benzalazine and ascaridole.

The polymerization temperature required for such compositions depends on both the particular initiator and polymerizable monomeric component involved in the system, primarily on the former. During the addition thermal polymerizations, the temperature will normally be within the range 0° C. to 250° C., and generally at 35° C. to 150° C. depending upon the type of initiator used. For instance, with the diacylperoxide initiators, the temperatures will normally range from 60° to 120° C.; with the persulfate or azo-type initiators temperatures will range normally from 25° to 120° C. and with the dialkyl peroxides temperatures will normally range from 100° to 150° C. The operable polymerization temperature range for these compositions can be markedly lowered (from 0° C. to 25° C. lower) by carrying out the thermal polymerization also under the influence of ultraviolet light, particularly in the case of the azo initiators.

The time of polymerization is likewise an interdependent variable depending on the particular initiator, the particular polymerizable monomer, and the temperature at which the polymerization is being effected. With the more readily polymerizable monomers and the more active initiators, especially in the higher temperature ranges, the necessary time of polymerization will be markedly lower, and conversely with the less easily polymerizable monomers, the less active initiators, and the lower polymerization temperatures the polymerization times will be markedly lengthened. Generally speaking, the normally used polymerization period will range from a few minutes to 24 hours with the preferred ranges being from 5 minutes to 2 hours.

Depending upon whether a highly rigid or flexible article is desired, the compositions to be thermally polymerized will vary marmkedly in the relative percentage of polymerizable monomeric component, particularly those components containing a plurality of polymerizable linkages. In many instances, the most convenient method of obtaining the flexible articles will be to incorporate into the compositions varying amounts of plasticizers and normally used in the plasticization of addition polymers. Suitable plasticizers include the various di, tri and low polyesters, e.g., dibutyl phthalate, dicyclohexyl phthalate, tricresyl phosphate, low polyalkylene glycol dibasic acid esters, such as low polypropylene glycol adipate, and the like. Because of the polar salt nature of both the compositions to be polymerized and the final ionic crosslinked salt copolymers, the preferred plasticizers likewise have polar groups, e.g., hydroxyl and carboxamide groups, in their structure.

Various inert solid substances, e.g., fillers or strengthening agents can be incorporated into the compositions to be thermally polymerized. Suitable such substances include neutral salts, i.e., barium sulfate; powder fillers, e.g., wood flour, mica, cotton flock and carbon black; metal oxides, i.e., titanium dioxide and chromic oxide; natural and synthetic resins, including ethylene/sulfur dioxide polymers, phenoplasts and aminoplasts, e.g., phenol/, urea/, and melamine/ formaldehyde resins, some of which serve also as plasticizer components; natural and synthetic fibers, e.g., cotton, wood, glass, nylon, polyester, acrylic polymer, etc. fibers, including polyhexamethyleneadipamide; polyethylene terephthalate, and polyacrylonitrile fibers, either in the form of simple fibers per se or as woven or non-woven fabrics.

These thermally polymerizable compositions have special utility in the so-called post-formable compositions which are preferably solid non-tacky compositions and which can be shaped as an entity into any desired form and cured in place by simple thermal means. Depending on the varying proportions of components, as described above, these thermally polymerized products can be obtained with varying degrees of cure from tight to loose, and can range in properties from the hard inflexible thermoset type products to the flexible elastomeric type. The end products, that is, the fully polymerized compositions having an ionically crosslinked salt copolymer structure, are characterized by high water vapor-permeability and low oil-permeability, also by relatively low swell when exposed to oils, particularly the hydrocarbon oils. Such properties make them useful as gaskets, adhesives, textile assistants and finishes. The high water vapor-permeability of the polymerized films is of particular importance in finishes because it prevents blistering.

As evident from the foregoing examples, this invention is generic to wholly carbon chain polymers having a plurality of lateral salt-forming substituents. Because of their ready availability and generally low cost, the preferred polymeric components are those wherein the lateral salt-forming substituents are acidic, i.e., carboxylic, phosphonic and sulfonic acid groups or are basic, for example, primary, secondary and tertiary amine groups. These lateral salt-forming substituents can be bonded to the carbon chain of the polymer, either directly and/or mediately, e.g., through ether, ester or amide linkages, preferably by those carrying no additional Zerewitinoff active hydrogens other than those in the salt-forming substituent.

Suitable additional acidic polymeric components include those containing a plurality of combined recurring monomer units wherein the addition polymerizable ethylenic unsaturation is not terminal, e.g., polymers of crotonic and sorbic acids, and those wherein the poymerizable ethylenic linkage is terminal, i.e., the polymers of the vinylidene monomers carrying acidic functions, e.g., addition polymers of vinyl-phosphonic, -sulfonic and -benzoic acids, p-vinylbenzenesulfonic acid; the acrylic acids, including the $\alpha$-substituted acrylic acids, e.g., acrylic, methacrylic, ethacrylic, chloroacrylic acids; vinyl phosphate and vinyl sulfate. The useful acidic polymers also include polymers of monomers carrying a plurality of acidic functions, e.g., the polymers of itaconic, citraconic and maleic acids. It is not necessary that the acidic polymers be polymers prepared from polymerizable acidic monomers. The necessary acidic functions can be introduced into a preformed polymer chain by suitable well-known procedures, for instance, the sulfonation of preformed styrene polymers.

Additional basic addition polymers having amine groups as lateral substituents on the main wholly carbon polymer chain which can be substituted for those in the foregoing examples are polymers of basic amino-substituted olefins, e.g., unsaturated basic amines including allylamine and diallylamine and basic amino-substituted styrenes including p-($\beta$-diethylaminoethyl)styrene and p-($\beta$-dimethylaminoethyl)styrene and polymers of basic nitrogen-containing heterocyclic compounds, e.g., vinyl pyridines and alkyl-substituted vinyl pyridines including 3-vinylpyridine, 2-methyl-5-vinylpyridine and 2-vinyl-5-ethylpyridine. Additional useful addition polymers are those (*a*) of esters of basic amino alcohols with unsaturated carboxylic acids including the alkyl and cycloalkyl substituted aminoalkyl and cycloalkyl esters of the acrylic and alkacrylic acids, e.g., β-methylaminoethyl acrylate, 4-diethylaminocyclohexyl methacrylate and β,β-dioctylaminoethyl acrylate; (*b*) of unsaturated ethers of basic amino alcohols, e.g., β-aminoethyl vinyl ether and β-diethylaminoethyl vinyl ether; and (*c*) of amides of unsaturated carboxylic acids wherein a basic amino substituent is carried on the amide nitrogen, e.g., N-(β-dimethylaminoethyl)acrylamide.

A large number of suitable polymers and copolymers of aminoalcohol esters of the α-hydrocarbon substituted acrylic acids which can be substituted in equivalent amount in the above examples and procedures are set forth in the working examples and disclosures in Graves U.S. Patent 2,138,763 and Harmon U.S. Patent 2,138,762.

Lateral basic amino substituents can be introduced by chemical modification of preformed wholly carbon chain addition polymers, for instance, by the reductive amination with ammonia, primary or secondary amines of the synthetic linear addition polymers carrying a plurality of recurring intrachain oxocarbonyl groups, e.g., the monoolefin/carbon monoxide polyketones, the polymers of vinyl ketones, e.g., methyl vinyl ketone, or by reduction or hydrogenation of polymers carrying a plurality of recurring nitrile groups including those of the polymerizable nitriles, such as acrylonitrile polymers and the like. In addition, polymers containing a plurality of recurring functional groups reactive with ammonia, primary, secondary and/or tertiary amines to form polymers containing lateral basic amino substituents can also be used including polymers containing lateral epoxy or oxirane substituents, e.g., the polymers of allyl glycidyl ether, glycidyl methacrylate, and the like, or polymers containing polar substituents reactive with ammonia and amines such as the strongly polar halogen-containing polymers, e.g., the polymers of vinyl chloroacetate and vinyl chloride.

As stated above, other neutral combined ethylenically unsaturated addition polymerizable monomer units can be present in the structure of the polymeric component, provided, however, that there is always present at least 1.0% on a molar combined monomer unit basis, of the necessary units containing the lateral salt-forming substituents. Examples of suitable units include: those having one ethylenic unsaturation, such as the monoolefins, e.g., ethylene, isobutylene; neutral acrylyl and α-substituted acrylyl compounds, e.g., the acrylic esters, nitriles and amides, such as acrylonitrile, methyl methacrylate, cyclohexyl methacrylate; vinyl and vinylidene halides, e.g., vinyl chloride, vinylidene chloride; fluorinated ethylenes, e.g., vinyl fluoride, vinylidene fluoride, tetrafluoroethylene; vinyl carboxylates, e.g., vinyl acetate, vinyl trimethylacetate, vinyl formate; vinyl aryls, e.g., styrene and vinyl naphthalene; and other polymerizable monoethylenically unsaturated monomers, such as the ketones and ethers, e.g., methyl vinyl ketone, vinyl ethyl ether, and the like. Other useful units are the combined polymerizable monomer units with a plurality of ethylenic double bonds, conjugated or not, such as the dienes, e.g., butadiene, 2-chlorobutadiene, 2-fluorobutadiene; the -ene/-yne type monomers, such as monovinyl acetylene and divinyl acetylene; the neutral esters of fumaric, maleic, itaconic, and citraconic acids. Also useful as combined units are carbon monoxide, sulfur dioxide, and acetylene, which are usually present only in the form of copolymers with other polymerizable monomers.

As in the case of the polymeric components, the necessary complementary salt-forming monomer units are not limited to those expressly disclosed in the foregoing examples. There must be present at least one addition polymerizable, ethylenically unsaturated monomer carrying as a substituent a salt-forming group which is complementary to the salt-forming group of the polymeric component being used. Stated simply, when the polymeric component contains acidic groups as the lateral salt-forming substituents, the complementary salt-forming monomer required will contain a basic substituent, such as the basic primary, secondary or tertiary amine groups. Conversely, when the polymeric component contains basic amino groups as the necessary lateral salt-forming substituents, the requisite complementary salt-forming monomer will carry one or more acidic groups, e.g., the carboxylic, phosphonic or sulfonic acid groups. It is obvious, therefore, that the requisite complementary salt-forming monomers correspond in reverse to the monomers of the previously listed polymers. For instance, when the polymeric component is one containing a plurality of lateral carboxylic acid substituents, such as a polymer of acrylic acid, the requisite complementary salt-forming monomer will generally be one of the ethylenically unsaturated addition polymerizable basic amines, e.g., p-(β-diethylaminoethyl)styrene, and the like. Conversely, when the polymeric component contains a plurality of basic amino groups as lateral substituents, e.g., the polymers of unsaturated ethers of basic amino alcohols, e.g., a polymer of β-aminoethyl vinyl ether, the requisite complementary salt-forming monomer component will contain acidic, e.g., carboxylic, phosphonic or sulfonic acid groups, such as vinyl sulfonic acid monomer, and the like. These addition polymerizable salt-forming monomers are capable of forming high polymers by photoinitiated addition polymerization in the presence of an addition polymerization initiator therefor activatable by actinic light.

While this invention is not limited by the theory, it is believed that the polymeric component of these new compositions first reacts through the lateral salt-forming substituents thereof with the complementary salt-forming substituent of the ethylenically unsaturated, addition polymerizable monomeric component to form a polymeric, addition polymerizable salt wherein the polymerizable ethylenically unsaturated groups are present as lateral substituents bonded mediately to the main carbon chain of the polymer through ionic salt groups. When the free radical generating addition polymerization initiator being used is activated by the requisite suitable means, i.e., by light and/or heat, the free radicals thereby generated initiate polymerization of the ethylenically unsaturated, addition polymerizable substituents linked through lateral ionic salt groups to the main polymer chain forming finally a crosslinked network polymer wherein the crosslinks are wholly ionic salt crosslinks and the main polymer chains are wholly carbon, one of them being that of the initial polymer, the other that of the polymer of the complementary salt-forming monomer used. The final product is an ionically crosslinked space network three-dimensional polymer exhibiting superior resistance to conventional nonpolar organic solvents, thereby permitting easy and controlled removal of substantially all of the initial polymer/monomer composition where it has not been polymerized and thus effecting a convenient and improved method of controlled polymerization in desired areas.

This invention also relates to photopolymerizable elements suitable for the direct preparation of relief printing images and the process of producing printing reliefs. Letterpress printing plates of uniform printing height can be prepared by exposing with actinic light through a process transparency, e.g., a process negative, a substantially transparent layer containing a photopolymerizable composition of this invention, i.e., a mixture of a wholly carbon chain addition polymer containing lateral salt-forming substituents, a complementary salt-forming, addition polymerizable, ethylenically unsaturated monomer, and, intimately dispersed therethrough, an addition polymerization initiator activatable by actinic light, preferably a free radical generating initiator, said layer or stratum being superposed on a suitable adherent support, i.e., adherent to the photopolymerized composition, until substantially complete polymerization of the complementary salt-forming monomer occurs in the exposed areas through to the base, whereby the layer in said areas is converted to the insoluble state, while substantially none occurs in the nonexposed areas, and, finally, essentially completely removing the layer in said nonexposed areas. Frequently, the layer will also contain added small amounts of addition polymerization inhibitors to stabilize the compositions against polymerization by heat and/or stray light. In the foregoing "process transparency" means an image bearing transparency consisting solely of substantially opaque and substantially transparent areas where the opaque areas are substantially of the same optical density, including the so-called line or halftone negative, and stencils wherein the non-cutout portions are light opaque.

In the preparation of directly produced printing reliefs, the thickness of the photopolymerizable layer is a direct function of the thickness desired in the relief image and this will depend on the subject being reproduced and particularly on the extent of the non-printing areas. In the case of halftones, the screen used also is a factor. In general, the thickness of the polymerizable layer to be photopolymerized on the base plate will vary from 0.003 to 0.25 inch. Layers ranging from 0.003 to about 0.06 inch in thickness will be used for the majority of letterpress printing plates. Layers thicker than 0.05–0.06 inch will be used for the printing of designs and relatively large areas in letterpress printing plates.

Actinic light from various sources and types can be used in carrying out this process. The light may emanate from point sources or be in the form of parallel rays or divergent beams. In order to reduce the exposure time, however, it is preferred to use a broad light source, i.e., one of large area as contrasted to a point source of light, close to the image-bearing transparency from which the relief image is to be made. By using a broad light source, relatively close to the image-bearing transparency, the light rays passing through the clear areas of the transparency will enter, as divergent beams, into the photopolymerizable layer, and irradiate underneath the clear portion of the transparency a continually diverging area in the photopolymerizable layer, resulting in the formation of a polymeric relief which has its greatest width at the bottom surface of the photopolymerized layer, the top surfae of the relief being the dimensions of the clear area. Such relief images are advantageous in printing plates because of their greater strength and the smooth continuous slope of their sides as contrasted to the undercut or jagged, irregular nature of the sides of photoengraved reliefs. This is of importance since the smooth sloping reliefs obtained in this process reduce or eliminate the problem of ink-buildup encountered with photoengraved plates.

Inasmuch as the photopolymerization initiators or catalysts generally exhibit their maximum sensitivity in the ultraviolet range, the light source should furnish an effective amount of this radiation. Such sources include carbon arcs, mercury vapor arcs, fluorescent lamps with special ultraviolet light emitting phosphors, argon glow lamps and photographic flood lamps. Of these, the mercury vapor arcs, particularly the sunlamp type, and the fluorescent sunlamps, are most suitable. Groups of these lamps can be easily arranged to furnish the broad light source required to give a frustum-shaped relief image of good mechanical strength. The sunlamp mercury vapor arcs are customarily used at a distance of 7 to 10 inches from the photopolymerizable layer. With a more uniform extended source of low intrinsic brilliance, such as a group of contiguous fluorescent lamps with special phosphors, the plate can be exposed within an inch of the lamps.

The support can be composed of any natural or synthetic product capable of existence in film or sheet form, and it can be flexible or rigid, reflective or non-reflective of actinic light. Because of their generally greater strength in thin form, e.g., foils, and readier adaptability for use in printing presses, it is preferable to use a metal as the support material. However, where weight is critical, synthetic resins or superpolymers, particularly thermoplastic ones, are preferable base materials. In those instances, where rotary press plates are desired, both types of base or support materials can be used to form flat relief plates which are then formed to the desired shape. The thermoplastic resins or high polymers are particularly suitable materials for such uses. Rotary press plates can also be prepared by using curved base plates having a layer of photopolymerizable compositions as described above and by exposing them directly through a concentrically disposed image-bearing transparency.

Suitable base or support materials include metals, e.g., steel and aluminum plates, sheets and foils, and films or plates composed of various film-forming synthetic resins or high polymers, and in particular vinylidene polymers, e.g., vinyl chloride polymers, vinylidene chloride copolymers with vinyl chloride, vinyl acetate, styrene, isobutylene or acrylonitrile; and vinyl chloride copolymers with the latter monomers; linear condensation polymers such as the polyesters, e.g., polyethylene terephthalate; polyamides, e.g., polyhexamethylene sebacamide; polyester amides, e.g., polyhexamethyleneadipamide/adipate; etc. Fillers or reinforcing agents can be present in the synthetic resin or polymer bases such as the various fibers (synthetic, modified or natural), e.g., cellulosic fibers, for instance, cotton, cellulose acetate, viscose rayon, paper; glass wool; nylon, and the like. These reinforced bases can be used in laminated form. The surface of the support or layer in contact with the photopolymerizable layer should be essentially continuous so that the relief images, e.g., halftone dots will have adequate support.

When highly reflective bases and particularly metal base plates are used, any oblique rays passing through clear areas in the image-bearing transparency will strike the surface of the base at an angle other than 90° and after resultant reflection will cause polymerization in non-image areas. The degree of unsharpness in the relief progressively increases as the thickness of the desired relief and the duration of the exposure increases. This disadvantage can be overcome by having on a light-reflective support an intervening stratum sufficiently absorptive of actinic light so that less than 35% of the incident light is reflected. This light-absorptive stratum must be adherent to both the photopolymerized image and the base material. The layer absorptive of reflected light, or antihalation layer, can be made by dispersing a finely-divided dye or pigment which substantially absorbs actinic light in a solution or aqueous dispersion of a resin or polymer which adheres to both the support and the photopolymerized image and coating the solution or dispersion on the support to form a layer which is dried. The antihalation layer may also serve as an anchor layer.

For use as photopolymerizable layers for printing reliefs, the compositions of this invention may contain, in addition to the salt-forming polymer/complementary salt forming monomer composition, photopolymerizable monoethylenic monomers which, when converted to linear polymers, serve to improve their properties, such as resistance to polar solvents. Suitable additional materials have been described above and include monounsaturated vinylidene monomers, particularly the acrylic and α-alkylacrylic esters, nitriles and amides, e.g., acrylamide and methacrylamide. These materials are preferably used in amounts between 5% and 35% of the weight of the total composition. In use, they polymerize in the exposed areas of the light-sensitive layer, and any unpolymerized (i.e., unexposed) monomer is readily removed at the same time as the non-crosslinked portions of the unsaturated salt compositions by solvent treatment.

The photopolymerizable layers may also, if desired, comprise other compatible monomeric or polymeric polyunsaturated materials which, under the influence of actinic light, polymerize to crosslinked insoluble polymers. These agents improve the rate or extent of the crosslinking throughout the photopolymerizable layer, and their presence facilitates the removal of the unexposed areas; they also serve to plasticize the compositions when an initially softer composition is desired. Useful materials are monomers or low polymers containing two terminal ethylenic unsaturations, preferably in conjugated systems, e.g., the methacrylic and acrylic acid diesters of ethylene glycol, diethylene glycol, and the low molecular weight polyethylene glycols; methacrylic and acrylic acid diesters of polymethylene glycols such as trimethylene glycol, hexamethylene glycol, etc.; divinylbenzene, crotyl methacrylate, diallyl phthalate, diallyl maleate and triallyl cyanurate. These additional crosslinking agents are preferably used in amounts between 1% and 30% by weight of the total compositions.

The photopolymerizable layers can also contain immiscible polymeric or non-polymeric organic or inorganic fillers or reinforcing agents which are essentially transparent, e.g., the organophilic silicas, bentonites, silica, powdered glass, etc. having a particle size less than 0.4 mil and in amounts varying with the desired properties of the photopolymerizable layer.

Practically any initiator or catalyst of addition polymerization which is capable of initiating polymerization under the influence of actinic light can be used in the photopolymerizable compositions of this invention. Because the conventional light sources give off heat and light, the preferred initiators of addition polymerization for making printing reliefs are not activatable thermally. They should be dispersible in the polymerizable polymeric salt to the extent necessary for initiating the desired polymerization under the influence of the amount of light energy absorbed in relatively short term exposures. Precautions can be taken to exclude heat rays so as to maintain the photopolymerizable layer at temperatures ineffective for activating the initiator thermally. However, the exclusion of heat rays makes necessary longer exposure times, since the rate of chain propagation in the polymerization reaction is lower at reduced temperatures. For this reason the photo-initiators most useful for this process are those which are not active thermally at temperatures below 80–85° C. The polymerization initiators are used in amounts of from 0.05 to 5% and preferably from 0.1 to 2.0% based on the weight of the total photopolymerizable composition.

Suitable polymerization initiators or catalysts include vicinal ketaldonyl compounds such as diacetyl, benzil, etc.; α-ketaldonyl alcohols such as benzoin, pivaloin, etc.; acyloin ethers such as benzoin methyl or ethyl ethers; α-hydrocarbon substituted aromatic acyloins including α-methylbenzoin, α-allylbenzoin, and α-phenylbenzoin.

The solvent liquid used for washing or "developing" the reliefs made from the photopolymerizable compositions of this invention should have good solvent action on the linear, i.e., non-crosslinked, salt-forming polymer/complimentary salt-forming monomer composition and little action on the hardened image in the time required to remove the non-crosslinked portions. Dioxane, acetone and methyl ethyl ketone, and mixtures thereof with methyl or ethyl alcohols are useful for most of these photopolymerizable compositions. Water is a useful solvent for many of the photopolymerizable compositions of this invention and it can be admixed with the solvents just mentioned. Other useful solvents include propyl acetate, toluene, ethylene glycol monoethyl ether and mixtures of two or more of such solvents. Mixtures of chlorinated aliphatic hydrocarbons such as dichloromethane, chloroform and carbon tetrachloride with methanol are also useful solvents. Preferred solvents are water and dilute aqueous organic and mineral acids and bases, e.g., acetic and hydrochloric acid; ammonium, alkali and alkaline earth metal hydroxides, carbonates and bicarbonates.

This invention provides a simple, effective process for producing letterpress printing plates from relatively inexpensive materials and with a marked reduction in labor requirements over the conventional photoengraving procedure. The images obtained are sharp and show fidelity to the original transparency both in small details and in overall dimensions. Many types of ruled line plates which could ordinarily be handled only by the tedious wax engraving technique can be made with the photopolymerizable compositions described above. The resulting photopolymerized printing plates are light in weight and reduce the amount of make-ready required on the press. The smooth clean shoulders of the image minimize ink buildup during use and reduce cleaning operations during a press run. The photopolymerized printing plates can be used to serve as stereotypes or electrotypes.

The printing reliefs made in accordance with this invention can be used in all classes of printing, including those wherein the ink is carried by the raised portion of the relief such as in dry-offset printing and ordinary letterpress printing and those wherein the ink is carried by the recessed portions of the relief such as in intaglio printing, e.g., line and inverted halftone. The plates are obviously useful for multicolor printing.

These compositions are also useful for many other purposes in which readily crosslinkable polymers are employed, such as the preparation of coatings, pellicles, sheets and cast objects of excellent hardness and scratch resistance as laminating resins and as binders for television phosphors.

The invention claimed is:

1. An addition polymerizable composition comprising as three different essential ingredients (*a*) an addition polymer having a molecular weight of at least 2500, a wholly carbon chain, and a plurality of one type of extralinear salt-forming group selected from the class consisting of the acidic carboxylic, sulfonic, phosphonic, sulfate, and phosphate type and the basic primary, secondary and tertiary amino type, (*b*) at least one ethylenically unsaturated, addition polymerizable monomer capable of forming a high polymer by photoinitiated addition polymerization in the presence of an addition polymerization initiator therefor activatable by actinic light and having at least one complementary salt-forming group from the aforesaid class, and (*c*) an addition polymerization initiator activatable by actinic light in an amount from 0.1 to 5.0%, by weight, of said composition; the amount of said salt-forming groups in the polymer being at least 1.0%, on a molar basis, of all combined monomer units thereof, and the amount of said salt-forming monomer being at least 10%, on a molar basis, of the said complementary extralinear salt-forming groups in the polymer.

2. A composition as set forth in claim 1 wherein said initiator is a free radical generating initiator activatable by actinic light.

3. A composition as set forth in claim 1 wherein said polymer component contains extralinear acid groups and said monomer component contains a salt-forming amine group.

4. A composition as set forth in claim 1 wherein said polymer component contains extralinear amine groups and said monomer component contains an acid group.

5. A composition as set forth in claim 4 wherein said polymer component is a polyvinyl pyridine and said monomer component is a carboxylic acid.

6. A composition as set forth in claim 4 wherein said polymer component is an addition polymer of an acrylic acid ester of an amino alcohol in which the amino nitrogen is tertiary and said monomer component contains a carboxylic acid group.

7. A composition as set forth in claim 6 wherein said ester is an α-alkacrylic acid ester.

8. A photopolymerizable element comprising a sheet support bearing a layer comprising as three different essential ingredients (*a*) an addition polymer having a molecular weight of at least 2500, a wholly carbon chain, and a plurality of one type of extralinear salt-forming group selected from the class consisting of the acidic carboxylic, sulfonic, phosphonic, sulfate, and phosphate type and the basic primary, secondary and tertiary amino type, (*b*) at least one ethylenically unsaturated, addition polymerizable monomer capable of forming a high polymer by photoinitiated addition polymerization in the presence of an addition polymerization initiator therefor activatable by actinic light and having at least one complementary salt-forming group from the aforesaid class, and (*c*) an addition polymerization initiator activatable by actinic light in an amount from 0.1 to 5.0% by weight, of said composition; the amount of said salt-forming groups in the polymer being at least 1.0%, on a molar basis, of all combined monomer units thereof, and the amount of said salt-forming monomer being at least 10%, on a molar basis, of the said complementary extralinear salt-forming groups in the polymer.

9. A element as set forth in claim 8 wherein said layer is solid and is at least 3 mils in thickness.

10. An element as set forth in claim 8 wherein said initiator is a free radical generating initiator.

11. An element as set forth in claim 8 wherein said polymer component contains extralinear amine groups and said monomer component contains an acid group.

12. An element as set forth in claim 8 wherein said polymer component contains extralinear acid groups and said monomer component contains a salt-forming amine group.

13. An element as set forth in claim 8 wherein said polymer component is a polyvinyl pyridine and said monomer component is a carboxylic acid.

14. An element as set forth in claim 8 wherein said polymer component is an addition polymer of an acrylic acid ester of an amino alcohol in which the amino nitrogen is tertiary and said monomer component contains a carboxylic acid group.

15. An element as set forth in claim 14 wherein said ester is an α-alkacrylic acid ester.

References Cited in the file of this patent

UNITED STATES PATENTS

| | | |
|---|---|---|
| 2,576,944 | Joy | Dec. 4, 1951 |
| 2,593,417 | D'Alelio | Apr. 22, 1952 |
| 2,610,962 | Smyers et al. | Sept. 16, 1952 |
| 2,614,089 | Harrison et al. | Oct. 14, 1952 |
| 2,692,826 | Neugebauer et al. | Oct. 26, 1954 |
| 2,697,039 | Martinson | Dec. 14, 1954 |
| 2,791,504 | Plambeck | May 7, 1957 |